(12) United States Patent
Shiomura (10) Patent No.: US 11,466,787 B2
(45) Date of Patent: Oct. 11, 2022

(54) SWITCHING VALVE, VALVE APPARATUS, HOLDING APPARATUS, LITHOGRAPHY APPARATUS, AND METHOD OF MANUFACTURING ARTICLE

(71) Applicant: CANON KABUSHIKI KAISHA, Tokyo (JP)

(72) Inventor: Yusuke Shiomura, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 7 days.

(21) Appl. No.: 17/109,361

(22) Filed: Dec. 2, 2020

(65) Prior Publication Data

US 2021/0190219 A1   Jun. 24, 2021

(30) Foreign Application Priority Data

Dec. 20, 2019   (JP) .............................. JP2019-230628

(51) Int. Cl.

| F16K 15/04 | (2006.01) |
|---|---|
| F16K 15/02 | (2006.01) |
| G03F 7/20 | (2006.01) |
| F16K 31/122 | (2006.01) |
| F16K 27/02 | (2006.01) |
| H01L 21/683 | (2006.01) |
| G03B 27/60 | (2006.01) |

(52) U.S. Cl.
CPC .......... *F16K 15/044* (2013.01); *F16K 15/026* (2013.01); *F16K 31/1221* (2013.01); *G03F 7/707* (2013.01); *F15B 2211/30505* (2013.01); *F16K 27/0209* (2013.01); *G03B 27/60* (2013.01); *H01L 21/6838* (2013.01); *Y10T 137/2544* (2015.04)

(58) Field of Classification Search
CPC ............. F16K 31/1221; H01L 21/6838; Y10T 137/2544
USPC ........................................... 355/73
See application file for complete search history.

(56) References Cited

U.S. PATENT DOCUMENTS

| 2,416,091 | A | * | 2/1947 | Fitch ....................... B64C 25/44 137/112 |
|---|---|---|---|---|
| 3,025,869 | A | * | 3/1962 | Kenfield ............. F16K 17/0433 137/102 |
| 6,050,081 | A | * | 4/2000 | Jansen .................... F02C 7/232 137/112 |
| 2013/0008715 | A1 | * | 1/2013 | Arteaga .................. E21B 33/06 175/5 |

OTHER PUBLICATIONS

"Examples of Application Circuits" TAIYO, Ltd., retrieved Dec. 5, 2019: pp. 1-4. English translation provided.

* cited by examiner

*Primary Examiner* — Robert K Arundale
(74) *Attorney, Agent, or Firm* — Rossi, Kimms & McDowell LLP (57) ABSTRACT

The present invention provides a switching valve comprising: a housing including a first port, a second port, and a third port; a valve element configured to be movable in the housing so as to selectively allow one of the first port and the second port to communicate with the third port in accordance with a pressure difference between the first port and the second port; and a pressing member configured to press the valve element toward a side of the first port.

7 Claims, 6 Drawing Sheets

SWITCHING VALVE, VALVE APPARATUS, HOLDING APPARATUS, LITHOGRAPHY APPARATUS, AND METHOD OF MANUFACTURING ARTICLE

BACKGROUND OF THE INVENTION

Field of the Invention

The present invention relates to a switching valve, a valve apparatus, a holding apparatus, a lithography apparatus, and a method of manufacturing an article.

Description of the Related Art

In a lithography apparatus used in manufacturing semiconductor devices or the like, in order to improve throughput, a holding apparatus that vacuum-holds an object such as a substrate is required to quickly change the pressure for holding and/or releasing the object. Non-patent reference 1 proposes an arrangement for improving the response of suction/vacuum break in a vacuum holding circuit using an electromagnetic valve.

When adding the electromagnetic valve to the holding apparatus, it can be necessary to significantly modify the control system of the holding apparatus, such as adding electrical wiring for controlling the electromagnetic valve and changing the control program for holding the substrate. Therefore, this can complicate the arrangement and control of the holding apparatus and be disadvantageous in terms of device cost.

[Non-Patent Reference 1] "Examples of Application Circuits", [online], TAIYO, Ltd., [Searched on Dec. 5, 2019], Internet <http://www.taiyo-ltd.co.jp/kpl_jp/product/Catalogue/pdf/valve/VA_ap.pdf>

SUMMARY OF THE INVENTION

The present invention provides, for example, a technique advantageous in implementing a quick pressure change with a simple arrangement.

According to one aspect of the present invention, there is provided a switching valve comprising: a housing including a first port, a second port, and a third port; a valve element configured to be movable in the housing so as to selectively allow one of the first port and the second port to communicate with the third port in accordance with a pressure difference between the first port and the second port; and a pressing member configured to press the valve element toward a side of the first port.

Further features of the present invention will become apparent from the following description of exemplary embodiments with reference to the attached drawings.

DESCRIPTION OF THE EMBODIMENTS

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

Figure 1:
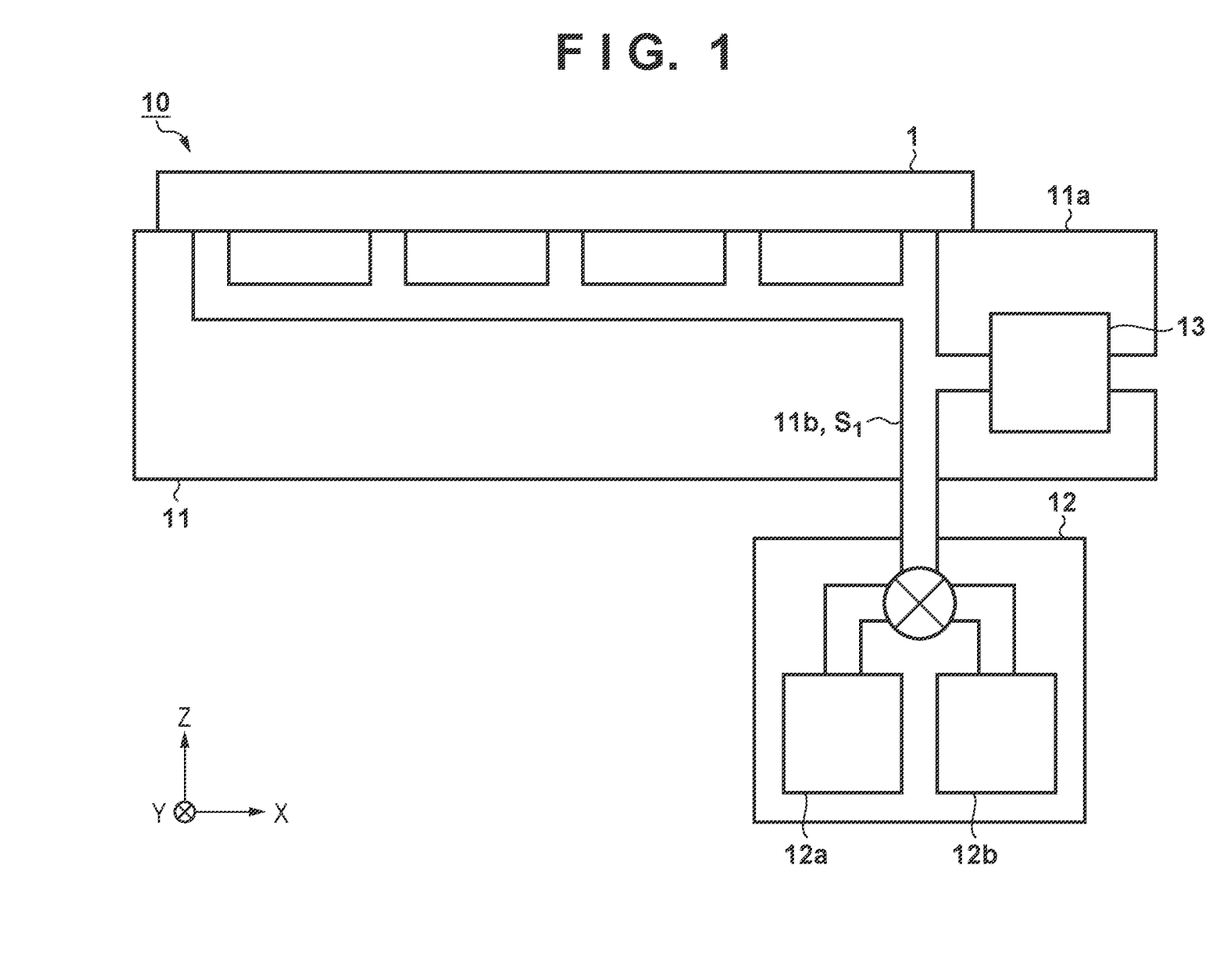
FIG. 1 is a schematic view showing the arrangement of a holding apparatus.

The first embodiment according to the present invention will be described. FIG. 1 is a schematic view showing the arrangement of a holding apparatus 10 of this embodiment. The holding apparatus 10 is an apparatus for vacuum-holding an object 1 (target object), and can include a holding member 11 (chuck), a gas controller 12, and a valve apparatus 13. When used in, for example, a lithography apparatus, the holding apparatus 10 can hold, as the object 1, an original such as a mask or a reticle and/or a substrate such as a glass plate or a semiconductor wafer.

The holding member 11 includes a surface 11a on which the object 1 is arranged and a flow passage 11b which becomes a closed space when the object 1 is arranged on the surface 11a. The gas controller 12 includes a vacuum source 12a that exhausts a gas from the flow passage 11b of the holding member 11, and a supply source 12b that supplies a gas to the flow passage 11b, and controls holding and releasing of the object 1 by the holding member 11 by changing the pressure in the flow passage 11b of the holding member 11. For example, in a case of causing the holding member 11 to hold the object 1, the gas controller 12 exhausts the gas from the flow passage 11b of the holding member 11 using the vacuum source 12a to decrease the pressure in the flow passage 11b. On the other hand, in a case of unloading the object 1 from the holding member 11, the gas controller 12 supplies a gas to the flow passage 11b of the holding member 11 using the supply source 12b to increase the pressure in the flow passage 11b.

Here, as has been described above, the holding apparatus 10 can be used in a lithography apparatus, and improvement of throughput is required in the lithography apparatus. Accordingly, the holding apparatus 10 is required to quickly perform holding and/or releasing of the object 1, so that it needs to quickly change the internal pressure in the flow passage 11b of the holding member 11. Therefore, the holding apparatus 10 of this embodiment is provided with the valve apparatus 13 as an assist apparatus that assists in changing the pressure in the flow passage 11b by the gas controller 12. The valve apparatus 13 is a mechanism for automatically switching communication/noncommunication of a first space $S_1$ with a second space $S_2$ isolated from the first space $S_1$ in accordance with the pressure difference between the spaces $S_1$ and $S_2$, without using any electronic component. In this embodiment, the first space $S_1$ is the internal space of the flow passage 11b of the holding member 11, and the second space $S_2$ can be the peripheral space of the holding member 11. In the following description, the pressure in the second space $S_2$ is assumed to be the atmospheric pressure, but it may be a pressure (air pressure) other that the atmospheric pressure.

Figure 2:
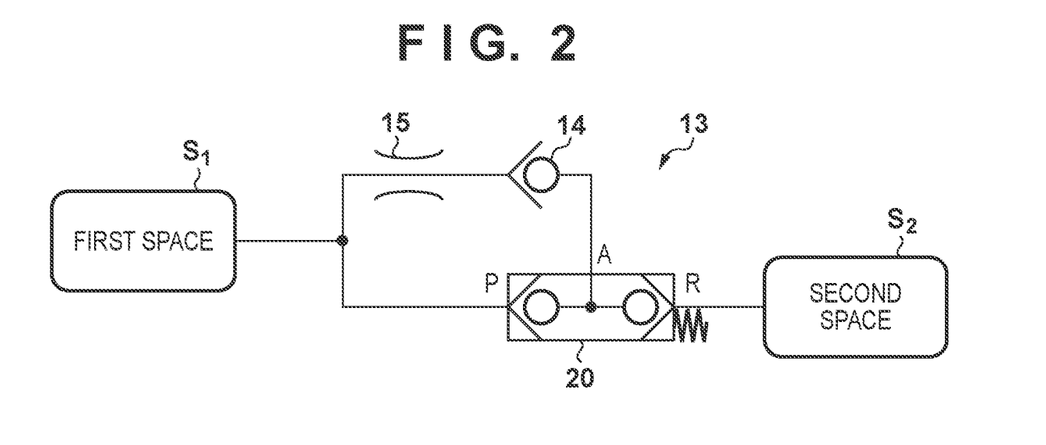
FIG. 2 is a piping circuit diagram of a valve apparatus.

FIG. 2 shows an example of the piping circuit diagram of the valve apparatus 13. The valve apparatus 13 can include, for example, a switching valve 20, a non-return valve (check valve) 14, and a throttling member (throttle valve) 15. As shown in FIG. 2, the switching valve 20 can include a first port P, a second port R, and a third port A. The first port P and the third port A communicate with the first space $S_1$ (the internal space of the flow passage 11b in this embodiment), and the second port R communicates with the second space $S_2$ (the peripheral space of the holding member 11 in this embodiment). The non-return valve 14 is provided in the flow passage between the first space $S_1$ and the third port A, and configured to allow the flow of a gas from the first space $S_1$ to the third port A of the switching valve 20 but prevent the flow of the gas from the third port A of the switching valve 20 to the first space $S_1$. The throttling member 15 is provided in the flow passage between the first space $S_1$ and the non-return valve 14, and configured to restrict (throttle) the flow rate of the gas flowing from the first space $S_1$ to the non-return valve 14 (that is, the third port A of the switching valve 20).

Figure 3A:
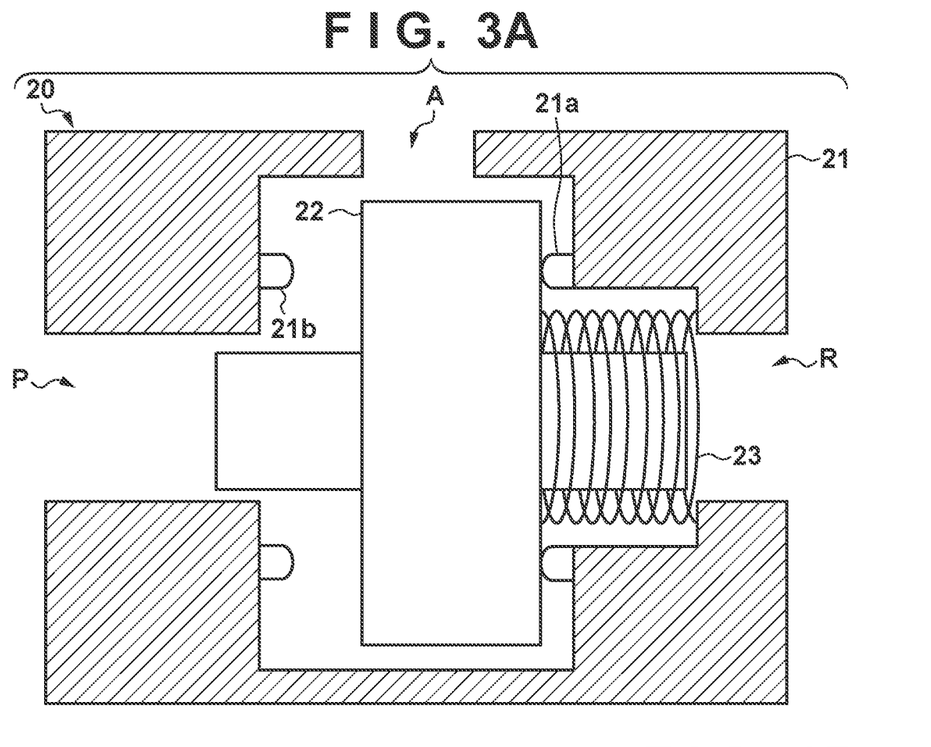
FIGS. 3A and 3B are sectional views showing the arrangement of a switching valve.
Figure 3B:
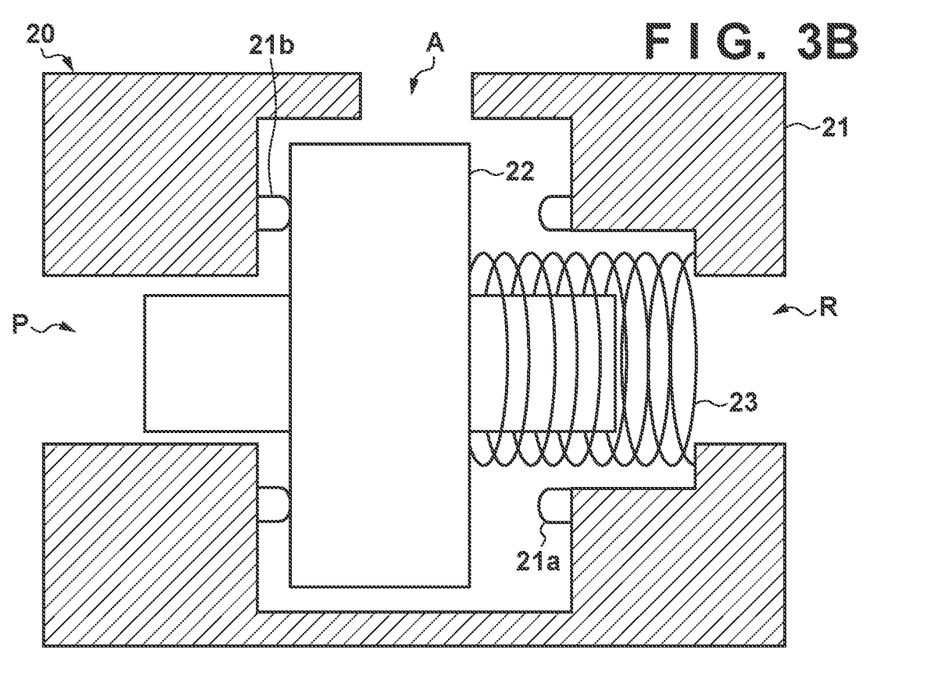

Next, the specific arrangement of the switching valve 20 will be described. FIGS. 3A and 3B are sectional views showing an arrangement example of the switching valve 20. The switching valve 20 is a mechanism (valve) for switching the port that communicates with the third port A between the first port P and the second port R in accordance with the pressure difference between the first port P and the second port R. The switching valve 20 includes a housing 21, a valve element 22, and a pressing member 23. The housing 21 includes the first port P, the second port R, and the third port A, and the valve element 22 is provided in the housing 21. The valve element 22 is configured to be movable in the housing so as to selectively allow one of the first port P and the second port R to communicate with the third port A in accordance with the pressure difference between the first port P and the second port R. More specifically, as shown in FIG. 3A, in a case where the valve element 22 moves to the second port R side and contacts a first valve seat 21a of the housing 21, the second port R is blocked by the valve element 22 and the first port P communicates with the third port A. On the other hand, as shown in FIG. 3B, in a case where the valve element 22 moves to the first port P side and contacts a second valve seat 21b of the housing 21, the first port P is blocked by the valve element 22 and the second port R communicates with the third port A.

The first valve seat 21a can be provided on the second port R side of a side wall defining the moving space of the valve element 22 in the housing 21 so as to surround the second port R. The second valve seat 21b can be provided on the first port R side of the side wall defining the moving space so as to surround the first port P. In this embodiment, each of the first valve seat 21a and the second valve seat 21b of the housing 21 is formed by an O-ring made of an elastic member such as synthetic rubber, but the present invention is not limited to this, and any arrangement can be employed as long as it prevents gas leakage when being in contact with the valve element 22. Further, the O-ring may be provided not in the housing 21 but in the valve element 22.

The pressing member 23 is a member that presses (applies a pressure to) the valve element 22 toward the first port side. That is, the pressing member 23 is a member that presses the valve element 22 to a direction of bringing the valve element 22 into contact with the second valve seat 21b. A spring member is used as the pressing member 23 in this embodiment, but the pressing member 23 is not limited to the spring member, and any member can be used as the pressing member 23 as long as it can apply a pressing force to the valve element 22. By providing such the pressing member 23, the pressure threshold value (this may be simply referred to as "pressure threshold value $V_{th}$" hereinafter) of the first port P which moves the valve element 22 to the second port R side can be offset by the pressing force of the pressing member 23 with respect to the pressure of the second port R.

More specifically, the pressure threshold value $V_{th}$ is defined as a total value of the pressure of the second port R (that is, the pressure in the second space $S_2$) and the pressing force of the pressing member 23. If the pressure of the first port P is equal to or smaller than the pressure threshold value $V_{th}$, as shown in FIG. 3B, this leads to a state in which the valve element 22 contacts the second valve seat 21b and the first port P is blocked, that is, a state in which the second port R communicates with the third port A. Then, if the pressure of the first port P becomes larger than the pressure threshold value $V_{th}$, as shown in FIG. 3A, this leads to a state in which the valve element 22 moves to the second port R side to contact the first valve seat 21a and the second port R is blocked, that is, a state in which the first port P communicates with the third port A.

Figure 4:
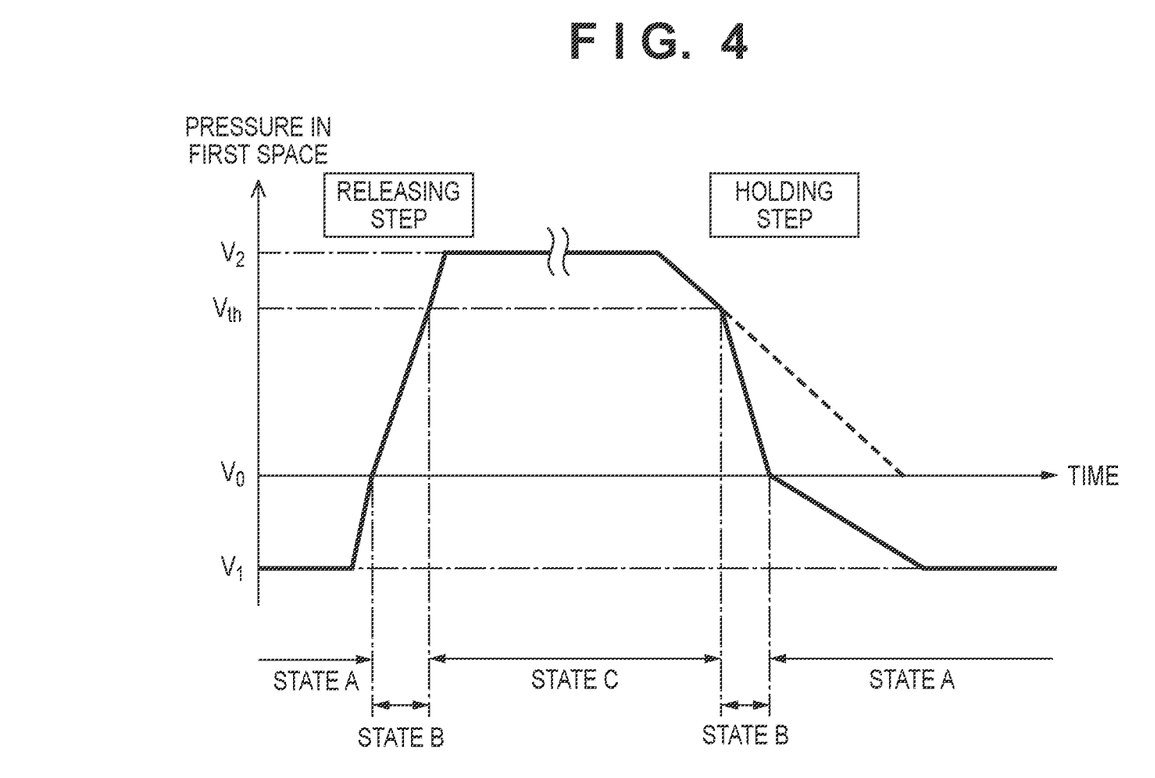
FIG. 4 is a graph showing the temporal change of the pressure in a first space.

Next, an operation example of the holding apparatus 10 of this embodiment will be described. FIG. 4 is a graph showing the temporal change of the pressure in the first space (the flow passage 11b of the holding member 11) in the holding apparatus 10 of this embodiment using the above-described valve apparatus 13. The left side of the graph shown in FIG. 4 illustrates a releasing step of releasing the object 1 from the holding member 11 by increasing the pressure in the first space $S_1$, and the right side thereof illustrates a holding step of causing the holding member 11 to hold the object 1 by decreasing the pressure in the first space $S_1$. Further, FIGS. 5A to 5C are piping circuit diagrams showing the operation of the valve apparatus 13 in the respective states (state A, state B, and state C) in the graph shown in FIG. 4, respectively.

Here, the pressure in the first space $S_1$ (the flow passage 11b of the holding member 11) can be changed between a first pressure value $V_1$ and a second pressure value $V_2$. The first pressure value $V_1$ is a value smaller than a pressure value $V_0$ of the second space $S_2$ (the peripheral space of the holding member 11), and is the vacuum pressure, for example. On the other hand, the second pressure value $V_2$ is a value larger than the pressure threshold value $V_{th}$, and is the pressure value corresponding to the weight of the object 1, that is, the pressure value at the time when the object 1 is lifted from the holding member 11 and the gas in the flow passage 11b escapes from a gap between the holding member 11 and the object 1, for example. That is, the pressure threshold value $V_{th}$ can be set (adjusted) using the pressing force of the pressing member 23 so as to be larger than the pressure value $V_0$ of the second space $S_2$ but smaller than the second pressure value $V_2$.

Figure 5A:
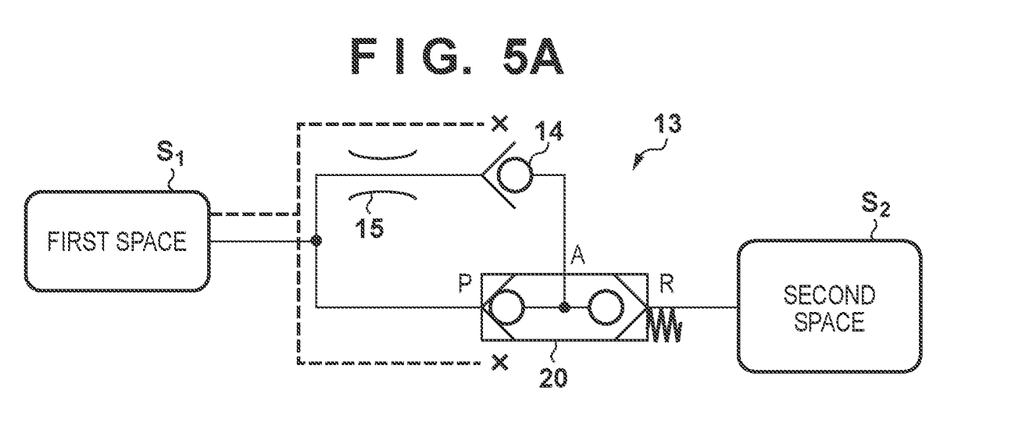
FIGS. 5A to 5C are piping circuit diagrams showing an operation of the valve apparatus.

In state A in which the pressure in the first space $S_1$ is equal to or smaller than the pressure value $V_0$ (for example, the atmospheric pressure) of the second space $S_2$, the first space $S_1$ and the second space $S_2$ do not communicate with each other as shown in FIG. 5A. More specifically, in this state A, the pressure of the first port P becomes smaller than the pressure threshold value $V_{th}$ in the switching valve 20. Accordingly, as shown in FIG. 3B, the second port R communicates with the third port A and the first port P is blocked by the valve element 22. Further, the flow of the gas from the third port A of the switching valve 20 with the high pressure to the first space $S_1$ with the low pressure is restricted (prevented) by the non-return valve 14. That is, in state A, the first space $S_1$ and the second space $S_2$ do not communicate with each other. Therefore, in the releasing step, it is possible to reduce a sudden inflow of the gas to the first space $S_1$, and in the holding step, it is possible to efficiently exhaust the gas in the first space $S_1$ using the vacuum source 12a.

Figure 5B:
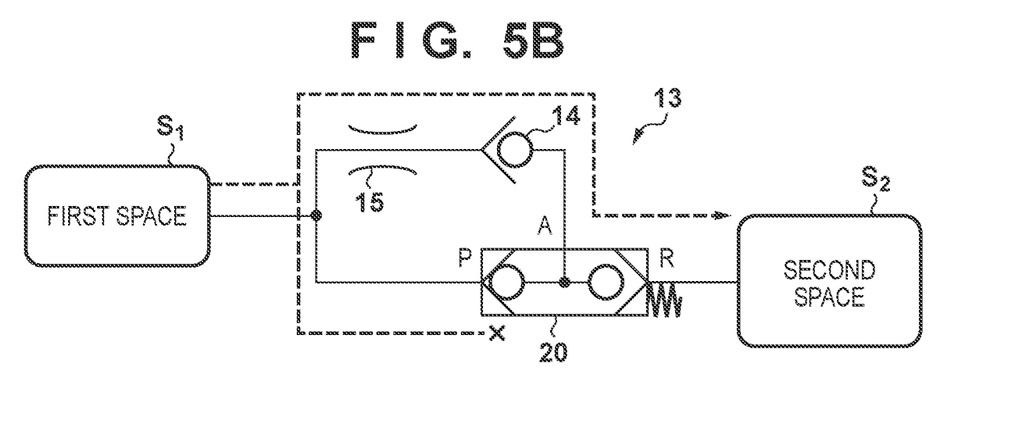
Figure 5C:
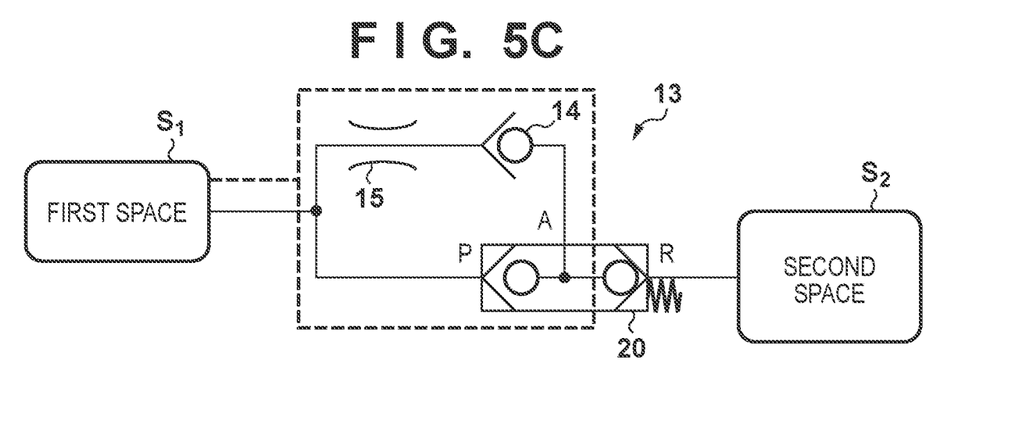

In state B in which the pressure in the first space $S_1$ becomes larger than the pressure value $V_0$ of the second space $S_2$ and equal to or smaller than the pressure threshold value $V_{th}$, as shown in FIG. 5B, the flow of the gas from the first space $S_1$ to the second space $S_2$ via the non-return valve 14 is formed. More specifically, in this state B, since the pressure of the first port P becomes smaller than the pressure threshold value $V_{th}$ in the switching valve 20, so that as shown in FIG. 3B, the second port R communicates with the third port A and the first port P is blocked by the valve element 22. On the other hand, the flow of the gas from the first space $S_1$ with the high pressure to the third port A of the switching valve 20 with the low pressure is allowed by the non-return valve 14. That is, in state B, the flow of the gas from the first space $S_1$ to the second space $S_2$ is formed, and it is possible to exhaust the gas in the first space $S_1$ to the second space $S_2$ in the holding step. Therefore, as compared with a conventional example (indicates by a broken line in FIG. 4) in which the valve apparatus 13 is not used, the time required for the holding step can be significantly shortened.

Here, in the releasing step, in order to quickly bring the pressure of the first port P to the pressure threshold value $V_{th}$, it is preferable to reduce the gas exhaustion from the first space $S_1$ to the second space $S_2$ as much as possible. In this embodiment, since the throttling member 15 is provided in the valve apparatus 13 and the throttling member 15 restricts the flow rate of the gas from the first space $S_1$ to the second space $S_2$, it is possible to reduce the gas exhaustion from the first space $S_1$ to the second space $S_2$. As has been described above, promotion of the gas exhaustion is required in the holding step, and reduction of the gas exhaustion is required in the releasing step. Therefore, the restriction of the flow rate of the gas by the throttling member 15 is preferably determined by experiments or simulations such that the total time of the holding step and the releasing step becomes equal to or smaller than an allowable value (preferably becomes the minimum value) based on the performance of the vacuum source 12a and the supply source 12b, and the like. Note that in a case in which, for example, the supply source 12b has the performance sufficient to quickly bring the pressure in the first space $S_1$ to the second pressure value $V_2$, no throttling member 15 may be provided in the valve apparatus 13.

In state C in which the pressure in the first space $S_1$ becomes larger than the pressure threshold value $V_{th}$, the first space $S_1$ and the second space $S_2$ are not allowed to communicate with each other as shown in FIG. 5C. More specifically, in this state C, since the pressure of the first port P becomes larger than the pressure threshold value $V_{th}$ in the switching valve 20, as shown in FIG. 3A, the valve element 22 moves to the second port R side so that the first port P communicates with the third port A and the second port R is blocked. That is, in state C, the first space $S_1$ and the second space $S_2$ do not communicate with each other. Therefore, it is possible to efficiently maintain the pressure in the first space $S_1$ to be equal to or larger than the pressure threshold value $V_{th}$ (second pressure value $V_2$) in the releasing step. On the other hand, it is preferable to quickly start exhausting the gas from the first space $S_1$ in the holding step, so that the pressing force of the pressing member 23 is preferably set (adjusted) so as to make the pressure threshold value $V_{th}$ close to the second pressure value $V_2$ as much as possible.

As has been described above, the holding apparatus 10 of this embodiment is provided with the valve apparatus 13 as an assist apparatus that assists in changing the pressure in the first space $S_1$ (the flow passage 11b of the holding member 11). The switching valve 20 included in the valve apparatus 13 includes the pressing member 23 that presses the valve element 22. With the arrangement as described above, it is possible to quickly perform holding and/or releasing of the object 1 by the holding apparatus 10 with a simple arrangement and control without using any electronic component. Here, in this embodiment, the holding apparatus 10 for holding the object 1 is exemplified, but the above-described valve apparatus 13 and the switching valve 20 are applicable to a piping circuit of any apparatus for quickly changing the pressure in a space.

Second Embodiment

The second embodiment according to the preset invention will be described. In this embodiment, the arrangement of a lithography apparatus will be described. The lithography apparatus is used, for example, in a lithography step performed when manufacturing a liquid crystal display device (liquid crystal panel) or a semiconductor device. Examples of the lithography apparatus are an exposure apparatus that exposes a substrate and a molding apparatus (an imprint apparatus or a planarization apparatus) that molds a composition on a substrate using a mold. The exposure apparatus will be described below as the example of the lithography apparatus.

Figure 6:
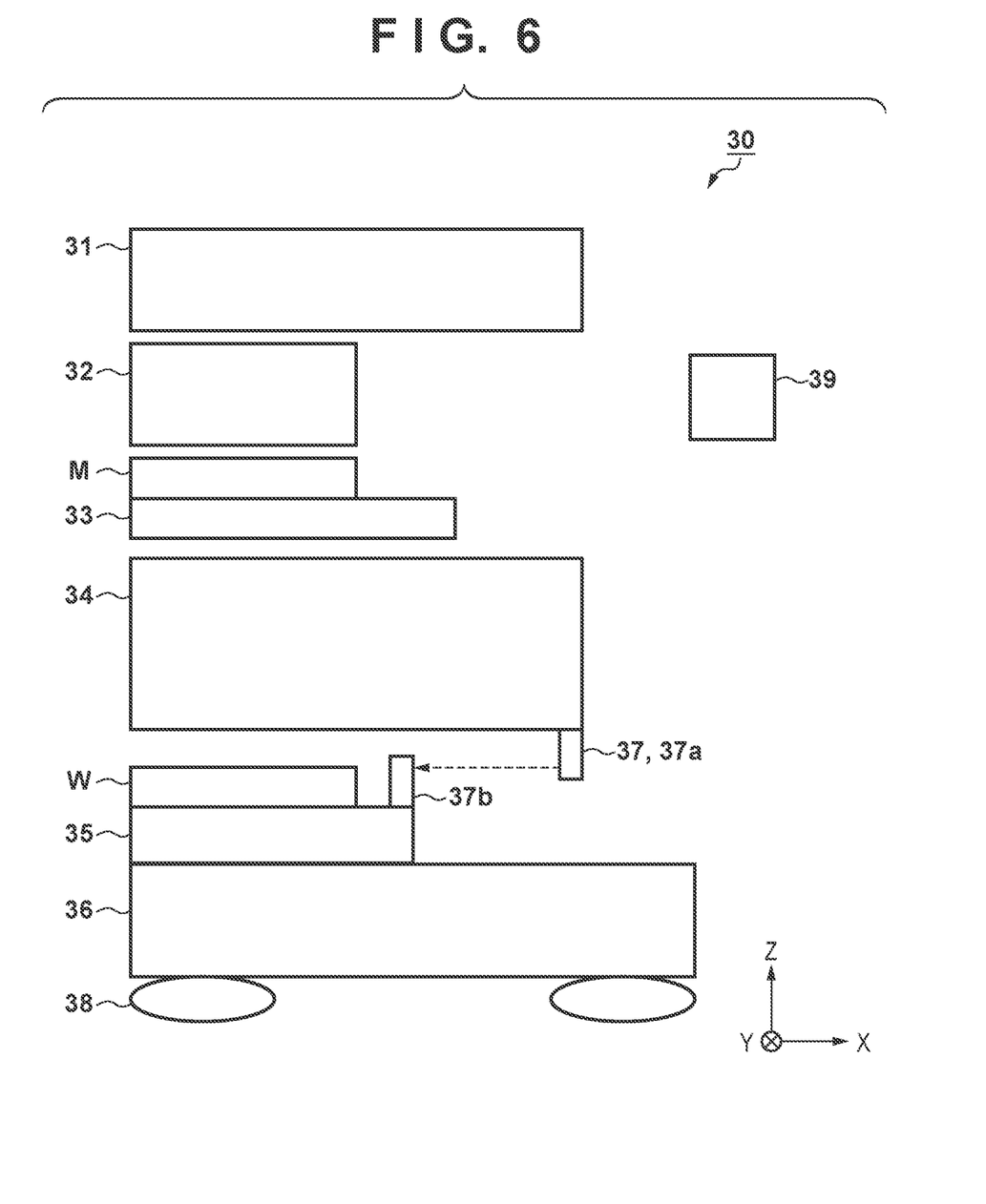
FIG. 6 is a schematic view showing the arrangement of an exposure apparatus.

FIG. 6 is a schematic view showing the arrangement of an exposure apparatus 30 of this embodiment. The exposure apparatus 30 exposes a substrate W (more specifically, a resist (photosensitive agent) applied on the substrate W)) with light having passed through an original M and a projection optical system to perform a process (exposure process) of transferring a pattern of the original M to each of a plurality of shot regions on the substrate W. The exposure apparatus of this embodiment is a step-and-scan type exposure apparatus (scanner) that transfers the pattern of the original M to the substrate W while relatively scanning the original M and the substrate W, but it may be a step-and-repeat type exposure apparatus (stepper). Here, for example, a mask, a reticle, or the like can be used as the original M, and a glass plate, a semiconductor wafer, or the like can be used as the substrate W.

The exposure apparatus 30 can include, for example, an illumination optical system 31, an original stage 33, a projection optical system 34, a substrate stage 35, and a controller 39. The controller 39 is formed by, for example, a computer including a CPU, a memory, and the like, and is electrically connected to respective units in the apparatus, thereby comprehensively controlling the overall operation of the apparatus (that is, controlling the exposure process of the substrate W). Here, the controller 39 may be formed so as to include the gas controller 12 of the holding apparatus 10 described in the first embodiment, or may be formed separately from the gas controller 12.

The illumination optical system 31 receives light emitted from a light source (not shown) such as a high-pressure mercury lamp, for example, and illuminates a part of the original M with illumination light shaped into a slit shape (for example, an arc shape). The original stage 33 is configured to hold the original M and be movable at least in the X direction and the Y direction. The projection optical system 34 projects the image of a part of the pattern formed on the original M, which is illuminated by the illumination optical system 31, onto the substrate W held by the substrate stage 35. The substrate stage 35 can be configured to hold the substrate W and be movable on a base 36 supported by vibration isolation tables 38. The original M held by the original stage 33 and the substrate W held by the substrate stage 35 are respectively arranged at optically conjugated positions (the object plane and the image plane of the projection optical system 34) via the projection optical system 34. The controller 39 can transfer the pattern of the original M onto the substrate by relatively synchronously scanning (for example, in the X direction) the original stage 33 and the substrate stage 35 at a speed ratio corresponding to the projection magnification of the projection optical system 34.

The exposure apparatus 30 of this embodiment can further include an alignment detection unit 32 and a measurement unit 37. The alignment detection unit 32 (alignment scope) includes, for example, an imaging sensor and an optical element, and detects the position of a mark provided on the substrate W via the original M and the projection optical system 34. The exposure apparatus 30 uses the alignment detection unit 32 to perform an alignment process (global alignment) in which the array information of a plurality of shot regions on the substrate W is obtained. The measurement unit 37 measures the position and posture of the substrate stage 35. For example, the measurement unit 37 can include a laser interferometer 37a that irradiates a mirror 37b provided on the substrate stage 35 with a light beam (laser beam) and measures the distance to the substrate stage 35 (mirror 37b) using the reflected light from the mirror 37b. Based on the measurement result of the measurement unit 37, the controller 39 can control the position and posture of the substrate stage 35.

In the exposure apparatus 30 of this embodiment, the holding apparatus 10 according to the present invention described in the first embodiment can be applied to the original stage 33 and/or the substrate stage 35. For example, the holding apparatus 10 can be applied to the original stage 33 to hold the original M as the object 1. Further, the holding apparatus 10 can be applied to the substrate stage 35 to hold the substrate W as the object 1. In this manner, by applying the holding apparatus 10 to the original stage 33 and/or the substrate stage 35, holding/releasing of the original M and/or the substrate W can be quickly performed, and this can be advantageous in terms of throughput.

<Embodiment of Method of Manufacturing Article>

A method of manufacturing an article according to the embodiment of the present invention is suitable for manufacturing an article, for example, a microdevice such as a semiconductor device or an element having a microstructure. The method of manufacturing an article according to the embodiment includes a forming step of forming a pattern to a photosensitive agent applied onto a substrate by using the above-described lithography apparatus (exposure apparatus) and a processing step of processing (developing) the substrate on which the pattern has been formed in the forming step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is advantageous in at least one of the performance, quality, productivity, and production cost of the article, as compared with a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-230628 filed on Dec. 20, 2019, which is hereby incorporated by reference herein in its entirety.

What is claimed is:

1. A valve apparatus configured to assist in changing a pressure in a first space, the valve apparatus comprising:
   a non-return valve; and
   a switching valve comprising:
      a housing including a first port, a second port, and a third port;
      a valve element configured to be movable in the housing so as to selectively allow one of the first port or the second port to communicate with the third port in accordance with a pressure difference between the first port and the second port; and
      a pressing member configured to press the valve element toward a side of the first port,
   wherein the first port and the third port of the switching valve communicate with the first space,
   wherein the second port of the switching valve communicates with a second space isolated from the first space, and
   wherein the non-return valve is arranged in a flow passage between the first space and the third port so as to allow a flow of gas from the first space to the third port but prevent the flow of gas from the third port to the first space.

2. The valve apparatus according to claim 1, further comprising a throttling member provided in a flow passage between the first space and the non-return valve and configured to restrict the flow rate of gas.

3. The valve apparatus according to claim 1, wherein a pressure in the first space is changed between a first pressure value smaller than a pressure in the second space and a second pressure value larger than a total value of a pressing force of the pressing member and the pressure in the second space.

4. The valve apparatus according to claim 1, wherein the pressure in the second space is an atmospheric pressure.

5. A holding apparatus that holds an object, the holding apparatus comprising:
   a holding member including a first space, which is a closed space by arranging the object;
   a controller configured to control holding and releasing of the object by the holding member by changing a pressure in the first space; and
   a valve apparatus including a non-return valve and a switching valve, and configured to assist in changing the pressure in the first space by the controller,
   wherein the switching valve comprises:
      a housing including a first port, a second port, and a third port;
      a valve element configured to be movable in the housing so as to selectively allow one of the first port or the second port to communicate with the third port in accordance with a pressure difference between the first port and the second port; and
      a pressing member configured to press the valve element toward a side of the first port,
   wherein the first port and the third port of the switching valve communicate with the first space, wherein the second port of the switching valve communicates with a second space isolated from the first space, and wherein the non-return valve is arranged in a flow passage between the first space and the third port so as to allow a flow of gas from the first space to the third port but prevent the flow of gas from the third port to the first space.

6. A lithography apparatus that forms a pattern on a substrate, the lithography apparatus comprising:

a holding apparatus configured to hold the substrate and comprising:

a holding member including a first space, which is a closed space by arranging the object;

a controller configured to control holding and releasing of the object by the holding member by changing a pressure in the first space; and a valve apparatus including a non-return valve and a switching valve, and configured to assist in changing the pressure in the first space by the controller, wherein the switching valve comprises:

a housing including a first port, a second port, and a third port;

a valve element configured to be movable in the housing so as to selectively allow one of the first port or the second port to communicate with the third port in accordance with a pressure difference between the first port and the second port; and a pressing member configured to press the valve element toward a side of the first port, wherein the first port and the third port of the switching valve communicate with the first space, wherein the second port of the switching valve communicates with a second space isolated from the first space, and wherein the non-return valve is arranged in a flow passage between the first space and the third port so as to allow a flow of gas from the first space to the third port but prevent the flow of gas from the third port to the first space.

7. A method of manufacturing an article, the method comprising:

forming a pattern on a substrate using a lithography apparatus that comprises a holding apparatus configured to hold the substrate;

processing the substrate, on which the pattern has been formed, to manufacture the article, wherein the holding apparatus comprises:

a holding member including a first space, which is a closed space by arranging the object;

a controller configured to control holding and releasing of the object by the holding member by changing a pressure in the first space; and a valve apparatus including a non-return valve and a switching valve, and configured to assist in changing the pressure in the first space by the controller, wherein the switching valve comprises:

a housing including a first port, a second port, and a third port;

a valve element configured to be movable in the housing so as to selectively allow one of the first port or the second port to communicate with the third port in accordance with a pressure difference between the first port and the second port; and a pressing member configured to press the valve element toward a side of the first port, wherein the first port and the third port of the switching valve communicate with the first space, wherein the second port of the switching valve communicates with a second space isolated from the first space, and wherein the non-return valve is arranged in a flow passage between the first space and the third port so as to allow a flow of gas from the first space to the third port but prevent the flow of gas from the third port to the first space.

* * * * *